(12) United States Patent
Korolik et al.

(10) Patent No.: US 7,614,411 B2
(45) Date of Patent: Nov. 10, 2009

(54) CONTROLS OF AMBIENT ENVIRONMENT DURING WAFER DRYING USING PROXIMITY HEAD

(75) Inventors: Mikhail Korolik, San Jose, CA (US);
John M. de Larios, Palo Alto, CA (US);
Mike Ravkin, Sunnyvale, CA (US);
Jeffrey Farber, Delmar, NY (US)

(73) Assignee: Lam Research Corporation, Fremont, CA (US)

( * ) Notice: Subject to any disclaimer, the term of this patent is extended or adjusted under 35 U.S.C. 154(b) by 381 days.

(21) Appl. No.: 10/817,398

(22) Filed: Apr. 1, 2004

(65) Prior Publication Data

US 2005/0145267 A1    Jul. 7, 2005

Related U.S. Application Data

(63) Continuation-in-part of application No. 10/261,839, filed on Sep. 30, 2002, now Pat. No. 7,234,477.

(51) Int. Cl.
*B08B 3/00* (2006.01)
(52) U.S. Cl. .................................. 134/102.1; 134/902
(58) Field of Classification Search ...................... 134/2, 134/21, 30, 95.2, 99.1, 106 R, 167 R, 198, 134/902
See application file for complete search history.

(56) References Cited

U.S. PATENT DOCUMENTS

| | | |
|---|---|---|
| 3,953,265 A | 4/1976 | Hood |
| 4,086,870 A | 5/1978 | Canavello et al. |
| 4,367,123 A | 1/1983 | Beck |
| 4,444,492 A | 4/1984 | Lee |
| 4,838,289 A | 6/1989 | Kottman et al. |
| 5,102,494 A | 4/1992 | Harvey et al. |
| 5,180,431 A | 1/1993 | Sugimoto et al. |
| 5,271,774 A | 12/1993 | Leenaars et al. |
| 5,294,257 A | 3/1994 | Kelly et al. |
| 5,343,234 A | 8/1994 | Kuehnle |
| 5,361,449 A | 11/1994 | Akimoto |
| 5,472,502 A * | 12/1995 | Batchelder .................... 118/52 |
| 5,558,111 A | 9/1996 | Lofaro |

(Continued)

FOREIGN PATENT DOCUMENTS

EP    0 905 746    3/1999

(Continued)

OTHER PUBLICATIONS

Lim et al., "*Atomic Layer deposition of transition metals*", Department of Chemistry and Chemical Biology, Harvard University, Nature Publishing Group, vol. 2, Nov. 2003, pp. 749-754.

(Continued)

*Primary Examiner*—Michael Barr
*Assistant Examiner*—Jason Heckert
(74) *Attorney, Agent, or Firm*—Martine Penilla & Gencarella, LLP (57) ABSTRACT

A method for processing a substrate is provided which includes generating a fluid meniscus to process the substrate and applying the fluid meniscus to a surface of the substrate. The method further includes reducing evaporation of fluids from a surface in the substrate processing environment.

15 Claims, 5 Drawing Sheets

U.S. PATENT DOCUMENTS

| | | | |
|---|---|---|---|
| 5,569,330 A * | 10/1996 | Schild et al. ............ 134/1 |
| 5,601,655 A * | 2/1997 | Bok et al. ............ 134/1 |
| 5,660,642 A | 8/1997 | Britten |
| 5,705,223 A | 1/1998 | Bunkofske ............ 427/240 |
| 5,709,757 A | 1/1998 | Hatano et al. |
| 5,807,522 A | 9/1998 | Brown et al. |
| 5,830,334 A | 11/1998 | Kobayashi |
| 5,882,433 A | 3/1999 | Ueno |
| 5,893,004 A | 4/1999 | Yamamura |
| 5,945,351 A | 8/1999 | Mathuni ............ 438/706 |
| 5,975,098 A | 11/1999 | Yoshitani et al. |
| 5,989,478 A | 11/1999 | Ouellette et al. |
| 5,997,653 A | 12/1999 | Yamasaka ............ 134/2 |
| 6,086,454 A | 7/2000 | Watanabe et al. |
| 6,092,937 A | 7/2000 | Snodgrass et al. |
| 6,103,636 A | 8/2000 | Zahorik et al. |
| 6,108,932 A | 8/2000 | Chai |
| 6,132,586 A | 10/2000 | Adams et al. |
| 6,214,513 B1 | 4/2001 | Cai et al. |
| 6,230,722 B1 | 5/2001 | Mitsumori et al. |
| 6,260,562 B1 * | 7/2001 | Morinishi et al. ......... 134/57 R |
| 6,341,998 B1 | 1/2002 | Zhang |
| 6,391,166 B1 | 5/2002 | Wang |
| 6,398,975 B1 * | 6/2002 | Mertens et al. ............ 216/92 |
| 6,417,117 B1 | 7/2002 | Davis |
| 6,433,541 B1 | 8/2002 | Lehman et al. |
| 6,474,786 B2 | 11/2002 | Percin et al. |
| 6,488,040 B1 | 12/2002 | De Larios et al. |
| 6,491,764 B2 * | 12/2002 | Mertens et al. ............ 134/36 |
| 6,495,005 B1 | 12/2002 | Colgan et al. |
| 6,514,570 B1 | 2/2003 | Matsuyama et al. |
| 6,530,823 B1 | 3/2003 | Goodarz et al. |
| 6,531,206 B2 | 3/2003 | Johnston et al. |
| 6,550,988 B2 | 4/2003 | Sugimoto et al. |
| 6,555,017 B1 | 4/2003 | Rushford et al. |
| 6,616,772 B2 | 9/2003 | De Larios et al. |
| 6,689,323 B2 | 2/2004 | Fisher et al. |
| 6,764,720 B2 | 7/2004 | Pui et al. |
| 6,799,584 B2 | 10/2004 | Yogev et al. |
| 6,854,473 B2 | 2/2005 | Hanson et al. |
| 6,954,993 B1 | 10/2005 | Smith et al. |
| 6,988,326 B2 | 1/2006 | O'Donnell et al. |
| 6,988,327 B2 | 1/2006 | Garcia et al. |
| 7,000,622 B2 | 2/2006 | Woods et al. |
| 7,069,937 B2 | 7/2006 | Garcia et al. |
| 2002/0023671 A1 * | 2/2002 | Mitsumori et al. ......... 134/151 |
| 2002/0121290 A1 | 9/2002 | Tang et al. |
| 2002/0125212 A1 | 9/2002 | Mertens et al. |
| 2003/0091754 A1 | 5/2003 | Chihani et al. |
| 2003/0092264 A1 | 5/2003 | Kajita et al. |
| 2004/0060573 A1 | 4/2004 | Woods |
| 2004/0069319 A1 | 4/2004 | Boyd et al. |
| 2004/0069329 A1 | 4/2004 | De Larios et al. |
| 2004/0136494 A1 | 7/2004 | Lof et al. |
| 2004/0178060 A1 | 9/2004 | Ravkin et al. |
| 2004/0182422 A1 | 9/2004 | Boyd et al. |
| 2005/0132515 A1 | 6/2005 | Boyd et al. |
| 2005/0139318 A1 | 6/2005 | Woods et al. |
| 2005/0145265 A1 | 7/2005 | Ravkin et al. |
| 2005/0145267 A1 | 7/2005 | Korolik et al. |
| 2005/0145268 A1 | 7/2005 | Woods |
| 2005/0148197 A1 | 7/2005 | Woods et al. |
| 2005/0217703 A1 | 10/2005 | O'Donnell |
| 2006/0064895 A1 | 3/2006 | Garcia et al. |

FOREIGN PATENT DOCUMENTS

| | | |
|---|---|---|
| EP | 0 905 746 A1 | 3/1999 |
| EP | 0 905 747 A1 | 3/1999 |
| EP | 1 489 461 A1 | 12/2004 |
| EP | 1 489 462 A2 | 12/2004 |
| JP | 05837190 | 3/1983 |
| JP | 62150828 A | 7/1987 |
| JP | 02280330 | 11/1990 |
| JP | 02309638 | 12/1990 |
| JP | 08277486 | 10/1996 |
| JP | 11031672 | 2/1999 |
| JP | 11350169 | 12/1999 |
| JP | 2003-151948 | 5/2003 |
| WO | WO 99/16109 A1 | 4/1999 |
| WO | WO 99/49504 | 9/1999 |
| WO | WO 02/01613 A3 | 1/2002 |
| WO | WO 02/32825 A1 | 4/2002 |
| WO | WO 02/101795 A3 | 12/2002 |
| WO | WO 03/014416 A2 | 2/2003 |
| WO | WO 2004/030051 A2 | 4/2004 |

OTHER PUBLICATIONS

ICKnowledge LLC, "*Technology Backgrounder: Atomic Layer Deposition*", ICKnowledge.com, 2004, pp. 1-7.

"*Chemical vapor deposition*", Wikipedia, the free encyclopedia, http://en.wikipedia.org/wiki/Chemical_vapor_deposition, 2005, p. 1-2.

Owa et al. "*Immersion lithography; its potential performance and issues*", Proceedings of the SPIE, SPIE, Bellingham, VA, US, vol. 5040, No. 1, Feb. 28, 2003, pp. 724- 733, XP002294500.

Sigma-Aldrich, "*Atomic Layer Deposition (ALD)*", http://www.sigmaaldrich.com/Area_of_Interest/Chemistry/Materials_Science/Thin_Films, 2005, pp. 1-2.

J.A. Britten, "A moving-zone Marangoni drying process for critical cleaning and wet processing," Oct. 1997, *Solid State Technology*.

\* cited by examiner

CONTROLS OF AMBIENT ENVIRONMENT DURING WAFER DRYING USING PROXIMITY HEAD

CROSS REFERENCE TO RELATED APPLICATION

This is a continuation-in-part of a U.S. patent application Ser. No. 10/261,839, from which priority under 35 U.S.C. § 120 is claimed, entitled "Method and Apparatus for Drying Semiconductor Wafer Surfaces Using a Plurality of Inlets and Outlets Held in Close Proximity to the Wafer Surfaces" filed on Sep. 30, 2002 now U.S. Pat. No. 7,234,477. The aforementioned patent application is hereby incorporated by reference.

BACKGROUND OF THE INVENTION

1. Field of the Invention

The present invention relates to semiconductor wafer processing and, more particularly, to apparatuses and techniques for more efficiently applying and removing fluids from wafer surfaces while reducing contamination and decreasing wafer cleaning cost.

2. Description of the Related Art

In the semiconductor chip fabrication process, it is well-known that there is a need to process a wafer using operations such as cleaning and drying. In each of these types of operations, there is a need to effectively apply and remove fluids for the wafer operation process.

For example, wafer cleaning may have to be conducted where a fabrication operation has been performed that leaves unwanted residues on the surfaces of wafers. Examples of such a fabrication operation include plasma etching (e.g., tungsten etch back (WEB)) and chemical mechanical polishing (CMP). In CMP, a wafer is placed in a holder which pushes a wafer surface against a rolling conveyor belt. This conveyor belt uses a slurry which consists of chemicals and abrasive materials to cause the polishing. Unfortunately, this process tends to leave an accumulation of slurry particles and residues at the wafer surface. If left on the wafer, the unwanted residual material and particles may cause, among other things, defects such as scratches on the wafer surface and inappropriate interactions between metallization features. In some cases, such defects may cause devices on the wafer to become inoperable. In order to avoid the undue costs of discarding wafers having inoperable devices, it is therefore necessary to clean the wafer adequately yet efficiently after fabrication operations that leave unwanted residues.

After a wafer has been wet cleaned, the wafer must be dried effectively to prevent water or cleaning fluid remnants from leaving residues on the wafer. If the cleaning fluid on the wafer surface is allowed to evaporate, as usually happens when droplets form, residues or contaminants previously dissolved in the cleaning fluid will remain on the wafer surface after evaporation (e.g., and form water spots). To prevent evaporation from taking place, the cleaning fluid must be removed as quickly as possible without the formation of droplets on the wafer surface. In an attempt to accomplish this, one of several different drying techniques are employed such as spin drying, IPA, or Marangoni drying. All of these drying techniques utilize some form of a moving liquid/gas interface on a wafer surface which, if properly maintained, results in drying of a wafer surface without the formation of droplets. Unfortunately, if the moving liquid/gas interface breaks down, as often happens with all of the aforementioned drying methods, droplets form and evaporation occurs resulting in contaminants being left on the wafer surface. The most prevalent drying technique used today is spin rinse drying (SRD).

Figures 1A, 1B:
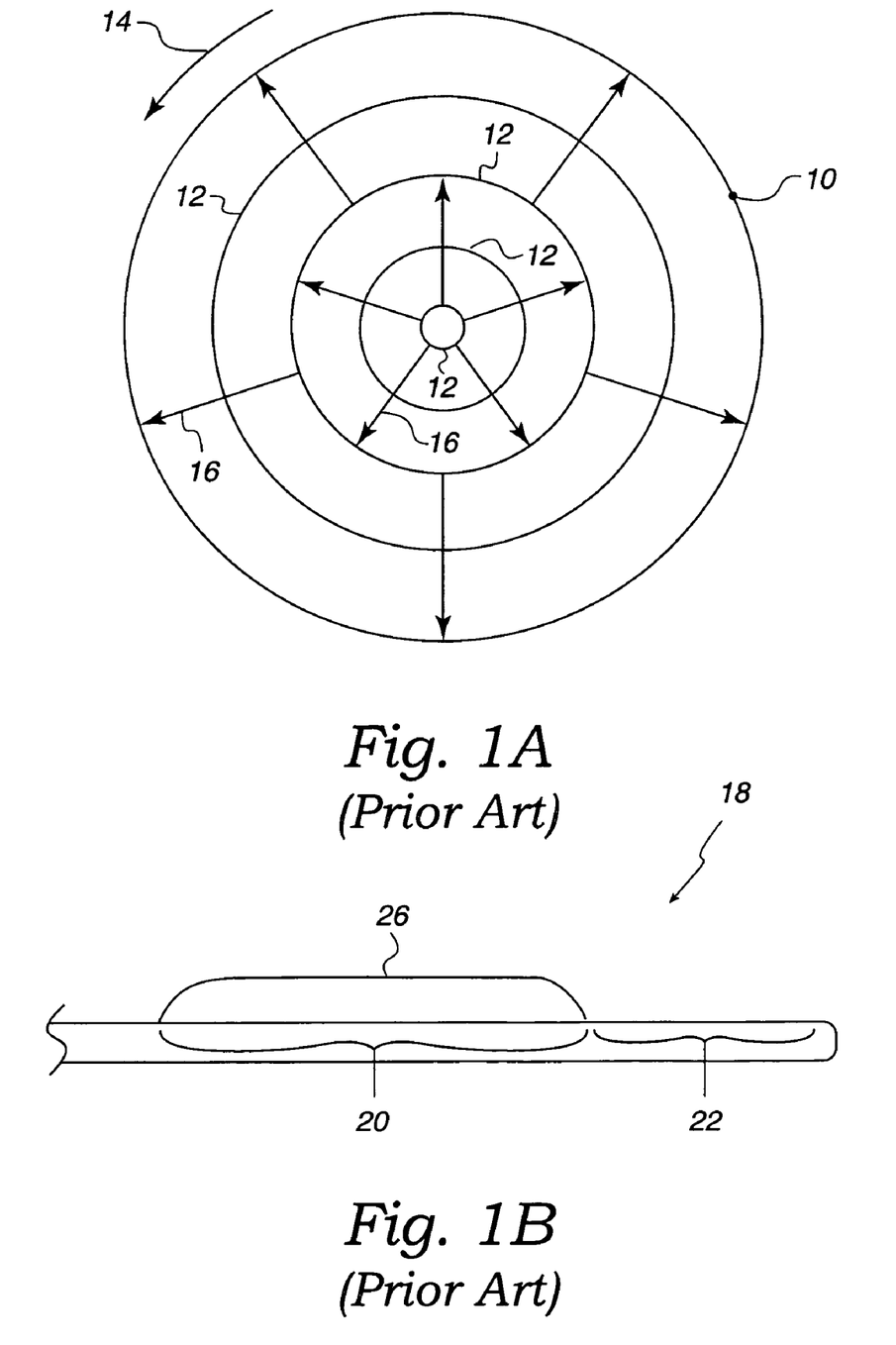
FIG. 1A illustrates movement of cleaning fluids on a wafer during an SRD drying process.
FIG. 1B illustrates an exemplary wafer drying process.

FIG. 1A illustrates movement of cleaning fluids on a wafer 10 during an SRD drying process. In this drying process, a wet wafer is rotated at a high rate by rotation 14. In SRD, by use of centrifugal force, the water or cleaning fluid used to clean the wafer is pulled from the center of the wafer to the outside of the wafer and finally off of the wafer as shown by fluid directional arrows 16. As the cleaning fluid is being pulled off of the wafer, a moving liquid/gas interface 12 is created at the center of the wafer and moves to the outside of the wafer (i.e., the circle produced by the moving liquid/gas interface 12 gets larger) as the drying process progresses. In the example of FIG. 1, the inside area of the circle formed by the moving liquid/gas interface 12 is free from the fluid and the outside area of the circle formed by the moving liquid/gas interface 12 is the cleaning fluid. Therefore, as the drying process continues, the section inside (the dry area) of the moving liquid/gas interface 12 increases while the area (the wet area) outside of the moving liquid/gas interface 12 decreases. As stated previously, if the moving liquid/gas interface 12 breaks down, droplets of the cleaning fluid form on the wafer and contamination may occur due to evaporation of the droplets. As such, it is imperative that droplet formation and the subsequent evaporation be limited to keep contaminants off of the wafer surface. Unfortunately, the present drying methods are only partially successful at the prevention of moving liquid interface breakdown.

In addition, the SRD process has difficulties with drying wafer surfaces that are hydrophobic. Hydrophobic wafer surfaces can be difficult to dry because such surfaces repel water and water based (aqueous) cleaning solutions. Therefore, as the drying process continues and the cleaning fluid is pulled away from the wafer surface, the remaining cleaning fluid (if aqueous based) will be repelled by the wafer surface. As a result, the aqueous cleaning fluid will want the least amount of area to be in contact with the hydrophobic wafer surface. Additionally, the aqueous cleaning solution tends cling to itself as a result of surface tension (i.e., as a result of molecular hydrogen bonding). Therefore, because of the hydrophobic interactions and the surface tension, balls (or droplets) of aqueous cleaning fluid forms in an uncontrolled manner on the hydrophobic wafer surface. This formation of droplets results in the harmful evaporation and the contamination discussed previously. The limitations of the SRD are particularly severe at the center of the wafer, where centrifugal force acting on the droplets is the smallest. Consequently, although the SRD process is presently the most common way of wafer drying, this method can have difficulties reducing formation of cleaning fluid droplets on the wafer surface especially when used on hydrophobic wafer surfaces. Certain portion of the wafer may have different hydrophobic properties.

FIG. 1B illustrates an exemplary wafer drying process 18. In this example a portion 20 of the wafer 10 has a hydrophilic area and a portion 22 has a hydrophobic area. The portion 20 attracts water so a fluid 26 pools in that area. The portion 22 is hydrophobic so that area repels water and therefore there can be a thinner film of water on that portion of the wafer 10. Therefore, the hydrophobic portions of the wafer 10 often dries more quickly than the hydrophilic portions. This may lead to inconsistent wafer drying that can increase contamination levels and therefore decrease wafer production yields.

Therefore, there is a need for a method and an apparatus that avoids the prior art by enabling optimized fluid management and application to a wafer that reduces contaminating deposits on the wafer surface. Such deposits as often occurs today reduce the yield of acceptable wafers and increase the cost of manufacturing semiconductor wafers.

SUMMARY OF THE INVENTION

Broadly speaking, the present invention fills these needs by providing a substrate processing apparatus that is capable of removing fluids in an effective manner on wafer surfaces while at the same time reducing wafer contamination. It should be appreciated that the present invention can be implemented in numerous ways, including as a process, an apparatus, a system, a device or a method. Several inventive embodiments of the present invention are described below.

In one embodiment, a method for processing a substrate is provided which includes generating a fluid meniscus to process the substrate and applying the fluid meniscus to a surface of the substrate. The method further includes reducing evaporation of fluids from a surface in the substrate processing environment.

In another embodiment, a method for processing a substrate is provided which includes generating a fluid meniscus to process the substrate and applying the fluid meniscus to a surface of the substrate. The method also includes managing a substrate processing environment so evaporation of fluids from a surface in the substrate processing environment is reduced.

In yet another embodiment, an apparatus for processing a substrate is provided which includes a proximity head capable of generating a fluid meniscus to process a substrate surface and a chamber configured to house the proximity head where the chamber also configured to be supplied with an environmental control gas.

In another embodiment, an apparatus for processing a substrate is provided which includes a proximity head capable of generating a fluid meniscus to process a substrate surface, and a conduit located on a surface of the proximity head configured to apply an environmental control gas to a region on a leading edge side of the proximity head.

The advantages of the present invention are numerous. Most notably, the apparatuses and methods described herein efficiently process (e.g., clean, dry, etc.) that involves optimal management of fluid application and removal from the wafer) semiconductor wafer while reducing unwanted fluids and contaminants remaining on a wafer surface. Consequently, wafer processing and production may be increased and higher wafer yields may be achieved due to efficient wafer processing.

The present invention enables optimal wafer processing through the generation and use of a fluid meniscus along with intelligent management of fluid evaporation from the wafer. Specifically, the relative humidity level of the atmosphere surrounding the wafer processing region may be managed so, for example, the relative humidity level of the atmosphere is at a high level. Therefore, when the relative humidity level of the wafer processing region is high, the fluid evaporation of the wafer is highly manageable. The entire wafer processing chamber may have a controlled atmosphere with a high relative humidity level. Additionally, a limited region around the wafer may have a controlled relative humidity level thereby keeping the fluid evaporation from the wafer at a manageable level.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION

An invention for methods and apparatuses for processing a substrate is disclosed. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

While this invention has been described in terms of several preferable embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

The figures below illustrate embodiments of an exemplary wafer processing system. Specifically, the figures below illustrate embodiments of an exemplary wafer processing system using proximity heads to generate a fluid meniscus in a controlled environment that reduces humidity levels in the wafer processing environment (also known as a substrate processing environment). It should be appreciated that the systems described here are exemplary, and that any other suitable type of configuration that would enable movement of the proximity head(s) into close proximity to the wafer may be utilized with a controlled environment. In the embodiments shown, the proximity head(s) may move in a linear fashion from a center portion of the wafer to the edge of the wafer. It should be appreciated that other embodiments may be utilized where the proximity head(s) move in a linear fashion from one edge of the wafer to another diametrically opposite edge of the wafer, or other non-linear movements may be utilized such as, for example, in a radial motion, in a circular motion, in a spiral motion, in a zig-zag motion, etc. The motion may also be any suitable specified motion profile as desired by a user. In addition, in one embodiment, the wafer may be rotated and the proximity head moved in a linear fashion so the proximity head may process all portions of the wafer. It should also be understood that other embodiments may be utilized where the wafer is not rotated but the proximity head is configured to move over the wafer in a fashion that enables processing of all portions of the wafer. In addition, the proximity head and the wafer processing system described herein may be utilized to clean and dry any shape and size of substrates such as for example, 200 mm wafers, 300 mm wafers, flat panels, etc. A fluid meniscus can be supported and moved (e.g., onto, off of and across a wafer) with a proximity head. Various proximity heads and methods of using the proximity heads are described in co-owned U.S. patent application Ser. No. 10/330,843 filed on Dec. 24, 2002 and entitled "Meniscus, Vacuum, IPA Vapor, Drying Manifold," which is a continuation-in-part of U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces," both of which are incorporated herein by reference in its entirety. Additional embodiments and uses of the proximity head are also disclosed in U.S. patent application Ser. No. 10/330,897, filed on Dec. 24, 2002, entitled "System for Substrate Processing with Meniscus, Vacuum, IPA vapor, Drying Manifold" and U.S. patent application Ser. No. 10/404,692, filed on Mar. 31, 2003, entitled "Methods and Systems for Processing a Substrate Using a Dynamic Liquid Meniscus." Still additional embodiments of the proximity head are described in U.S. patent application Ser. No. 10/404,270, filed on Mar. 31, 2003, entitled "Vertical Proximity Processor," U.S. patent application Ser. No. 10/603,427, filed on Jun. 24, 2003, and entitled "Methods and Systems for Processing a Bevel Edge of a Substrate Using a Dynamic Liquid Meniscus," U.S. patent application Ser. No. 10/606,022, filed on Jun. 24, 2003, and entitled "System and Method for Integrating In-Situ Metrology within a Wafer Process," U.S. patent application Ser. No. 10/607,611 filed on Jun. 27, 2003 entitled "Apparatus and Method for Depositing and Planarizing Thin Films of Semiconductor Wafers," U.S. patent application Ser. No. 10/611,140 filed on Jun. 30, 2003 entitled "Method and Apparatus for Cleaning a Substrate Using Megasonic Power," and U.S. patent application Ser. No. 10/742,303 entitled "Proximity Brush Unit Apparatus and Method." The aforementioned patent applications are hereby incorporated by reference in their entirety.

Figure 2A:
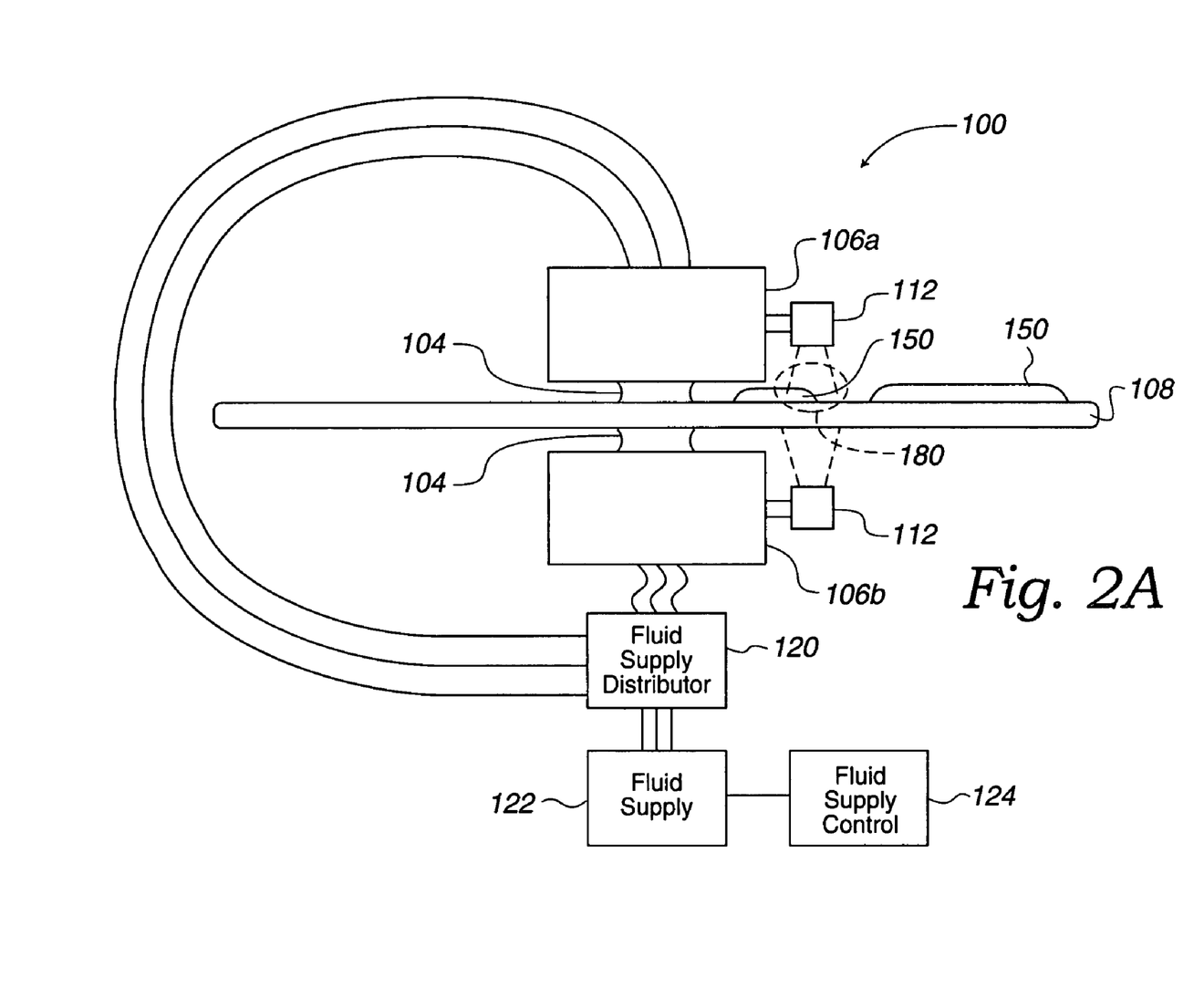
FIG. 2A shows a wafer processing system in accordance with one embodiment of the present invention.

FIG. 2A shows a wafer processing system 100 in accordance with one embodiment of the present invention. The system 100 includes proximity heads 106a and 106b which may generate a fluid meniscus as discussed above in the U.S. Patent Applications incorporated by reference. In one embodiment the proximity head 106a is in close proximity above the wafer and the proximity head 106b is in close proximity below the wafer in close proximity to the wafer. It should also be appreciated that the system 100 may be configured in any suitable manner as long as the proximity head (s) may be moved in close proximity to the wafer to generate and control a meniscus. It should also be understood that close proximity may be any suitable distance from the wafer as long as a meniscus may be maintained. In one embodiment, the proximity heads 106a and 106b (as well as any other proximity head described herein) may each be located between about 0.1 mm to about 10 mm from the wafer to generate the fluid meniscus on the wafer surface. In a preferable embodiment, the proximity heads 106a and 106b (as well as any other proximity head described herein) may each be located bout 0.5 mm to about 4.5 mm from the wafer to generate the fluid meniscus on the wafer surface, and in more preferable embodiment, the proximity heads 106a and 106b (as well as any other proximity head described herein) may be located about 2 mm from the wafer to generate the fluid meniscus on the wafer surface.

In one embodiment, the system 100, the proximity heads 106a and 106b may be moved from processed to unprocessed portions of the wafer. It should be appreciated that the proximity heads 106a and 106b may be movable in any suitable manner that would enable movement of the proximity heads 106a and 106b to process the wafer as desired. It should be understood that although the wafer processing system 100 is shown with the proximity heads 106a and 106b, any suitable number of proximity heads may be utilized such as, for example, 1, 2, 3, 4, 5, 6, etc. The proximity heads 106a and/or 106b of the wafer processing system 100 may also be any suitable size or shape as shown by, for example, any of the proximity heads as described herein. The different configurations described herein generate a fluid meniscus between the proximity head and the wafer. The fluid meniscus may be moved across the wafer to process the wafer by applying fluid to the wafer surface and removing fluids from the surface. In such a way, depending on the fluids applied to the wafer, cleaning, drying, etching, and/or plating may be accomplished. Therefore, the proximity heads 106a and 106b can have any numerous types of configurations as shown herein or other configurations that enable the processes described herein. It should also be appreciated that the system 100 may process one surface of the wafer or both the top surface and the bottom surface of the wafer.

In addition, besides processing the top and/or bottom surfaces of the wafer, the system 100 may also be configured to process one side of the wafer with one type of process (e.g., etching, cleaning, drying, plating, etc.) and process the other side of the wafer using the same process or a different type of process by inputting and outputting different types of fluids or by using a different configuration meniscus. The proximity heads can also be configured to process the bevel edge of the wafer in addition to processing the top and/or bottom of the wafer. This can be accomplished by moving the meniscus off (or onto) the edge of the wafer to process the bevel edge. It should also be understood that the proximity heads 106a and 106b may be the same type of apparatus or different types of proximity heads.

In an exemplary wafer processing operation, the unprocessed areas of the wafer may be presented to the proximity heads 106a and 106b through both the linear motion of the proximity heads 106a and 106b and through the rotation of the wafer 108. The wafer processing operation itself may be conducted by at least one of the proximity heads. Consequently, in one embodiment, processed portions of the wafer 108 would expand from a center region to the edge region of the wafer 108 in a spiral movement as the processing operation progresses. In another embodiment, when the proximity heads 106a and 106b are moved from the periphery of the wafer 108 to the center of the wafer 108, the processed portions of the wafer 108 would expand from the edge region of the wafer 108 to the center region of the wafer 108 in a spiral movement.

In an exemplary processing operation, it should be understood that the proximity heads 106a and 106b may be configured to dry, clean, etch, and/or plate the wafer 108. In an exemplary drying embodiment, the at least one of first inlet may be configured to input deionized water (DIW) (also known as a DIW inlet), the at least one of a second inlet may be configured to input $N_2$ carrier gas containing isopropyl alcohol (IPA) in vapor form (also known as IPA inlet), and the at least one outlet may be configured to remove fluids from a region between the wafer and a particular proximity head by applying vacuum (also known as vacuum outlet). It should be appreciated that although IPA vapor is used in some of the exemplary embodiments, any other type of vapor may be utilized such as for example, nitrogen, any suitable alcohol vapor, organic compounds, volatile chemicals, etc. that may be miscible with water. It should be appreciated that the any suitable alcohol can be any suitable carbon-based chemical with a hydroxy group attached to a saturated carbon atom.

In an exemplary cleaning embodiment, a cleaning solution may be substituted for the DIW such as, for example, SC-1, SC-2, etc. In addition, other types of solutions may be inputted into the first inlet and the second inlet depending on the processing operation desired.

It should be appreciated that the inlets and outlets located on a face of the proximity head may be in any suitable configuration as long as a stable meniscus as described herein may be utilized. In one embodiment, the at least one $N_2$/IPA vapor inlet may be adjacent to the at least one vacuum outlet which is in turn adjacent to the at least one processing fluid inlet to form an IPA-vacuum-processing fluid orientation. It should be appreciated that other types of orientations such as IPA-processing fluid-vacuum, processing fluid-vacuum-IPA, vacuum-IPA-processing fluid, etc. may be utilized depending on the wafer processes desired and what type of wafer processing mechanism is sought to be enhanced. In another embodiment, the IPA-vacuum-processing fluid orientation may be utilized to intelligently and powerfully generate, control, and move the meniscus located between a proximity head and a wafer to process wafers. The processing fluid inlets, the $N_2$/IPA vapor inlets, and the vacuum outlets may be arranged in any suitable manner if the above orientation is maintained. For example, in addition to the $N_2$/IPA vapor inlet, the vacuum outlet, and the processing fluid inlet, in an additional embodiment, there may be additional sets of IPA vapor outlets, processing fluid inlets and/or vacuum outlets depending on the configuration of the proximity head desired. It should be appreciated that the exact configuration of the IPA-vacuum-processing fluid orientation may be varied depending on the application. For example, the distance between the IPA input, vacuum, and processing fluid input locations may be varied so the distances are consistent or so the distances are inconsistent. In addition, the distances between the IPA input, vacuum, and processing fluid input may differ in magnitude depending on the size, shape, and configuration of the proximity head 106a and the desired size of a process meniscus (i.e., meniscus shape and size). In addition, exemplary IPA-vacuum-processing fluid orientation may be found as described in the U.S. Patent Applications referenced above.

In one embodiment, the proximity heads 106a and 106b may be positioned in close proximity to a top surface and a bottom surface respectively of the wafer 108 and may utilize the IPA and DIW inlets and a vacuum outlet(s) to generate wafer processing meniscuses in contact with the wafer 108 which are capable of processing the top surface and the bottom surface of the wafer 108. The wafer processing meniscus may be generated in accordance with the descriptions in reference to Applications referenced and incorporated by reference above. At substantially the same time the IPA and the processing fluid is inputted, a vacuum may be applied in close proximity to the wafer surface to remove the IPA vapor, the processing fluid, and/or the fluids that may be on the wafer surface. It should be appreciated that although IPA is utilized in the exemplary embodiment, any other suitable type of vapor may be utilized such as for example, any suitable vapor of alcohol, ketone, ether, hexanol, ethyl glycol, organic compounds, etc. that may be miscible with water. These fluids may also be known as surface tension reducing fluids. The portion of the processing fluid that is in the region between the proximity head and the wafer is the meniscus. It should be appreciated that as used herein, the term "output" can refer to the removal of fluid from a region between the wafer 108 and a particular proximity head, and the term "input" can be the introduction of fluid to the region between the wafer 108 and the particular proximity head.

In one embodiment, the system 100 further includes a fluid supply distributor 120 that can supply to and remove fluids from the proximity heads 106a and 106b. It should be appreciated that the fluid supply distributor 120 may be any suitable apparatus that can supply and receive fluids in an organized manner such as, for example, a manifold. In one embodiment, the fluid supply distributor 120 receives fluid from a fluid supply 122. The fluid supply 122 may be managed and controlled by a fluid supply control 124 which may be any suitable hardware/software that can manage fluid input to the proximity heads 106a and 106b. The proximity heads 106a and 106b may produce meniscus 104 that may process the wafer 108.

In one exemplary wafer processing operation, the wafer 108 may have different portions therein that can have different evaporation rates. For example, fluid 150 may accumulate on portions of the wafer 108 with slower evaporation rates as compared with other portions of the wafer 108 with a higher evaporation rates. Higher evaporation rates may occur when portions of the wafer 108 are hydrophobic (repels water molecules) and therefore results in a thinner film of fluid than portions of the wafer 108 that are hydrophilic (attracts water). Consequently, when the film of fluid such as, for example, water is thinner, there may be less layers of water molecules to evaporate from the surface resulting in exposed contaminated dried areas due to uncontrolled evaporation.

In one embodiment of the system 100, fluid sensors 112 may detect portions of the wafer that have thinner layers of fluid and therefore, through in situ metrology different wafer locations with different fluid evaporation rates may be detected. It should be appreciated that any suitable manner of in situ metrology may be utilized which can detect the thickness of the fluid film on the wafer 108. A region 180 as discussed further in detail in reference to FIG. 2B has different portions with different evaporation rates as can be detected by the fluid sensors 112 through the determination of fluid thickness. Environmental management may be conducted to reduce the problems of variable fluid evaporation rates from the wafer surface.

As discussed below, the environment of a wafer processing region (e.g., atmosphere immediately around a region of the wafer which the meniscus 104 is processing or is about to process) (also know as a substrate processing environment) may be controlled and managed in an intelligent manner so humidity is kept at a high level. In addition, the chamber where the wafer is being processed can be controlled and managed to keep the humidity in the chamber at a high level. Therefore, by intelligently managing the environment in the wafer processing region to keep humidity at an optimal level, the fluid evaporation rate from the wafer 108 may be decreased thereby reducing uncontrolled drying of wafer regions.

Figure 2B:
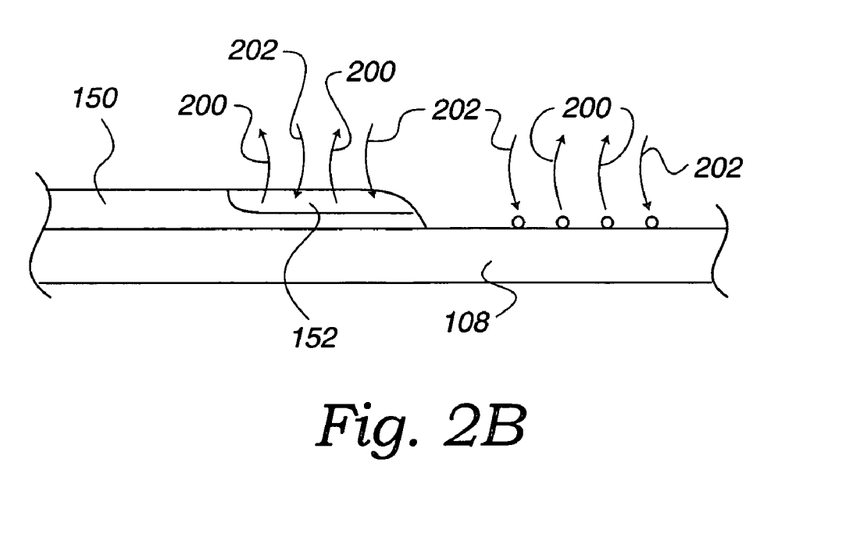
FIG. 2B shows the region which has different portions with different evaporation rates in accordance with one embodiment of the present invention.

FIG. 2B shows the region 180 which has different portions with different evaporation rates in accordance with one embodiment of the present invention. In one embodiment, the region 180 includes the fluid 150 near the proximity head 106 as the proximity head 106 (as shown in FIG. 2A) moves toward the region 180. The fluid 150 includes a portion 152 which shows evaporation and reassimilation of water molecules to and from the portion 152. The portion 152 therefore may includes evaporating liquid molecules 200 and reassimilating liquid molecules 202. In one embodiment, the liquid molecules are water molecules. The region 180 also shows areas of the wafer 108 without the fluid 150 that has a more hydrophobic region and therefore has already dried before the area with the fluid 150. In the area without the fluid 150, evaporating molecules 200 counteract the reassimilating molecules 202 and therefore that surface of the wafer 108 stays dry.

Figure 3:
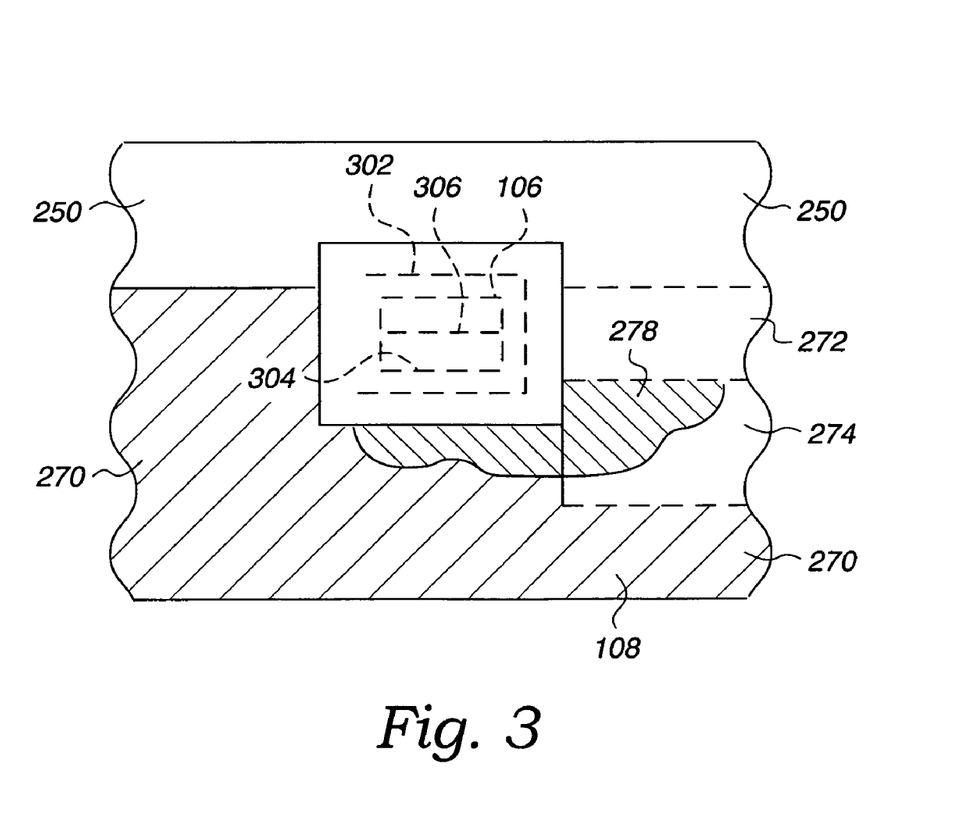
FIG. 3 illustrates a proximity head during a wafer processing operation in accordance with one embodiment of the present invention.

FIG. 3 illustrates a proximity head 106 during a wafer processing operation in accordance with one embodiment of the present invention. In one embodiment, the proximity head 106 may produce a fluid meniscus to process the wafer 108. In one embodiment of a drying operation, the proximity head 106 includes inlets 302 and 306 which may input IPA/$N_2$ and deionized water (DIW) respectively. An outlet 304 may generate vacuum which can remove the IPA/$N_2$ and the DIW (as well as any other fluid on the wafer 108) from a surface of the wafer 108. In such an exemplary embodiment, the proximity head 106 may process the wafer 108 so a wet region 270 can be dried to generate a dry region 250. In one example, a region 272 is a just recently dried region processed by the proximity head 106, and a region 274 is a portion of the surface of the wafer 108 yet to be processed. In one example, the region 274 may have fluid 278 which includes portions of the wafer surface that has different drying rates. The different drying rates may be generated due to wafer surface variations such as hydrophobic and hydrophilic regions. In another example, different drying rates may be generated by IPA/$N_2$ application to the wafer 108 during the processing of the region 272. During such processing, IPA/$N_2$ that is being applied to the region 272 of the wafer 108 may overflow into an adjacent region such as the region 274. Therefore, the application of IPA/$N_2$ may create a condition where a higher evaporation rate may occur in the region 274. By managing the humidity of the atmosphere of the region where the wafer 108 is being processed, the evaporation rate of nearly all regions of the wafer 108 may be managed and therefore, the contamination of the wafer 108 may be reduced due to the controlled drying of the wafer 108.

Figure 4:
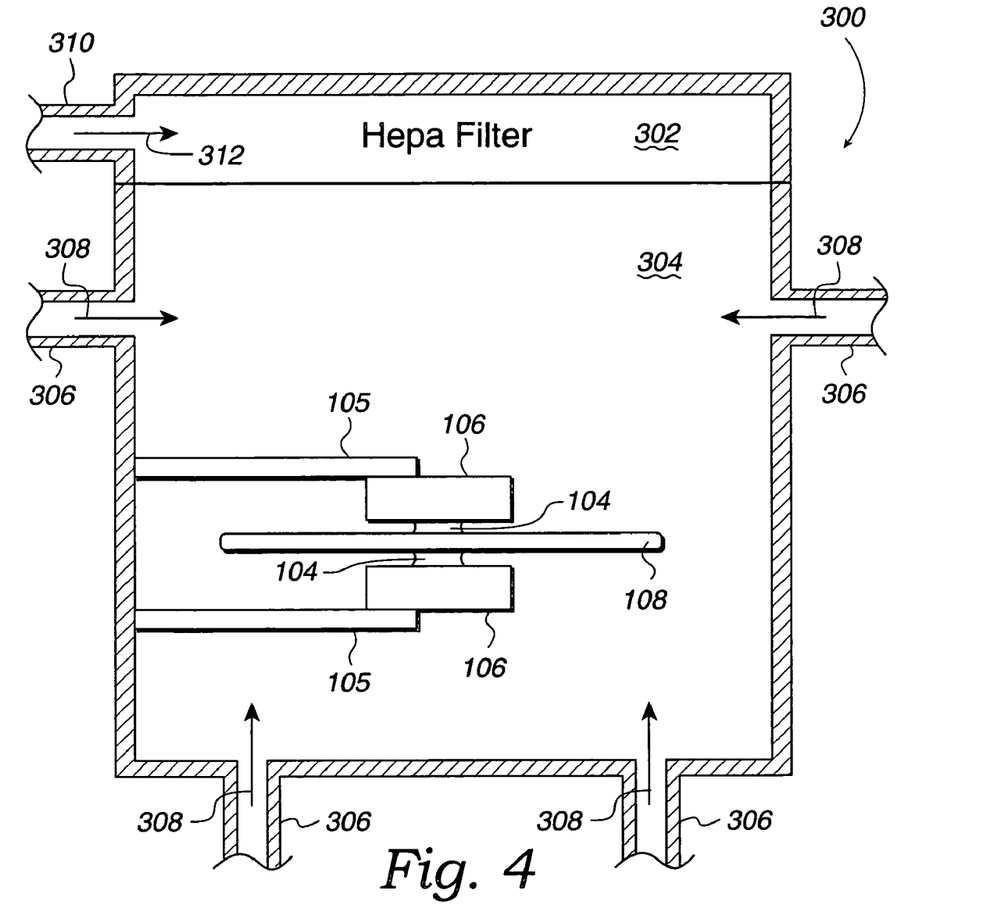
FIG. 4 shows a wafer processing chamber in accordance with one embodiment of the present invention.

FIG. 4 shows a wafer processing chamber 300 in accordance with one embodiment of the present invention. The chamber 300 includes proximity heads 106 attached to arms 105 which may move the proximity heads 106 into close proximity to the wafer 108 for wafer processing operations such as, for example, cleaning, drying, etc. The proximity heads 106 may produce meniscus 104 that can process a surface of the wafer 108. Exemplary meniscus may be generated by apparatuses and methodology as described in the U.S. Patent Applications referenced above to process the wafer 108.

In one embodiment, the wafer processing chamber 300 includes a HEPA filter 302 that may supply substantially purified atmosphere to the chamber 300. In one embodiment, the HEPA filter 302 may purify air supplied through input 310. In another embodiment, the HEPA filter 302 may purify any suitable type of atmosphere such as, for example, IPA/$N_2$, Ar, $N_2$, $O_2$, $O_2/N_2$, He, Ne, Xe, etc. It should be appreciated that the term atmosphere may be any suitable gas that can carry the desired amount of relative humidity. The chamber 300 may also include inputs 306 which may provide a atmosphere with a controlled level of humidity. In one embodiment, the inputs 306 may supply gas with a high enough relative humidity level to decrease evaporation from the wafer 108. It should be appreciated that any suitable type of inert gas or vapor may be utilized as a carrier gas for carrying the high relative humidity level such as, for example, IPA/$N_2$, $N_2$, air (CDA), Ar, $O_2/N_2$, $O_2$, etc. In another embodiment, the chamber 300 may be supplied with atmosphere, such as, for example air, that has between 10% to about 100% relative humidity. In a preferable embodiment, the atmosphere that is supplied to the chamber 300 may have greater than 80% relative humidity. Therefore, in one embodiment, a controlled environment 304 of the processing chamber 300 may include an atmosphere with a high level of relative humidity in conjunction with meniscus 104 generated by the proximity heads 106 to intelligently and powerfully control wafer processing operations through the management of fluid evaporation from the wafer surface.

Figure 5:
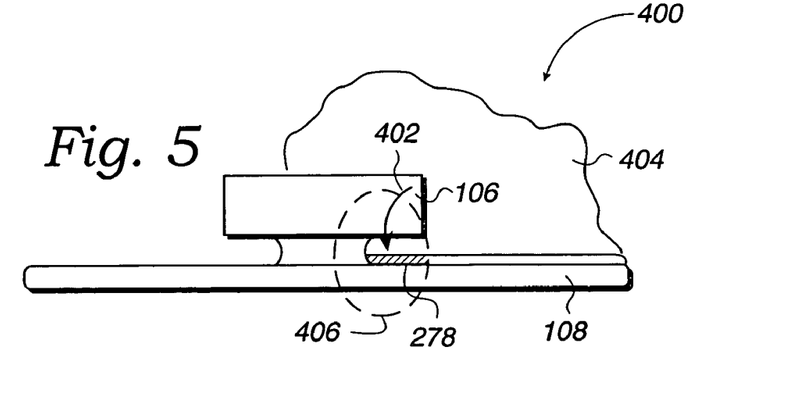
FIG. 5 shows a wafer processing environment in accordance with one embodiment of the present invention.

FIG. 5 shows a wafer processing environment 400 in accordance with one embodiment of the present invention. In one embodiment, the wafer processing environment 400 includes a control envelope 404 which encompasses the region where the relative humidity is controlled so that, in one embodiment, the atmosphere in that region has a high level of relative humidity. In a preferable embodiment, the atmosphere may contain enough humidity so liquid molecules (e.g., water molecules) evaporating into the atmosphere is the same or less than the liquid molecules being assimilated back into liquid form on the wafer surface.

In one embodiment, the control envelope 404 may be generated through application of a suitable gas with a high relative humidity through inlet 402 of the proximity head 106. In another embodiment, the inlet 402 may apply vapor to maintain some concentration of a particular liquid in water such as, for example, IPA/$N_2$, acetone, any suitable type of alcohol, etc. including the azeotropic mixtures. It should be understood that although IPA is discussed in exemplary embodiments, that other types of chemicals may be utilized that enables the methodology discussed herein. It should be appreciated that the any suitable alcohol can be any suitable chemical compound that includes carbon and a hydroxy group. An azeotropic ratio means that the ratio of the chemical composition of a liquid mixture is the same as the ratio of chemical composition of the vapor from the liquid mixture. As described herein the gas with the high relative humidity and the vapor/gas that may maintain some concentration of a particular liquid (e.g. IPA) in water may be known as an environmental control gas. In one embodiment, IPA/$N_2$ vapor may be applied to water on the wafer surface through the inlet 401 to maintain some concentration of IPA in the water including the azeotropic mixture on the wafer surface. This may intelligently and powerfully reducing unwanted evaporation from the wafer surface. In one embodiment, the inlet 402 may be on a leading edge of the proximity head 106 and may apply the gas with a high relative humidity to the wafer 108. When high relative humidity gas is applied to water on the wafer surface, the evaporation rate is decreased thereby decreasing unwanted wafer drying. The leading edge of the proximity head 106 is a region where the proximity head encounters unprocessed wafer surface such as wafer surface with fluid 278 within wafer region 406. It should be appreciated that the gas with a high level of relative humidity may be applied at or near the control envelope in any suitable fashion from any suitable location by any suitable apparatus. Therefore, the inlet 402 is just an exemplary embodiment that can apply controlled gas to reduce evaporation of fluids on the wafer surface. In this way the wafer region 406 may be kept in a controlled evaporative state before wafer processing of that particular region begins.

In addition, in one embodiment, the level of relative humidity in the control envelope may be managed through varying the flow rate of a gas with high relative humidity or by applying a gas that may maintain some concentration of a particular liquid (e.g., IPA) in water including the azeotropic mixture. In such an embodiment, the flow rate of the gas with high relative humidity may be increased thereby increasing the overall liquid level in the control enveloped 404. It should be appreciated that any suitable type of gas that may generate the desired level of evaporative rate of a fluid on surface of the wafer can be utilized. In one embodiment, when a gas with a high relative humidity is used, a relative humidity higher than 50% can be utilized to manage the wafer processing environment to reduce unwanted drying and lower contamination levels on wafers. In another embodiment, a relative humidity of the gas may be between 90% and 100%, and in a preferable embodiment, a gas with a relative humidity of about 100% may be used.

Figure 6:
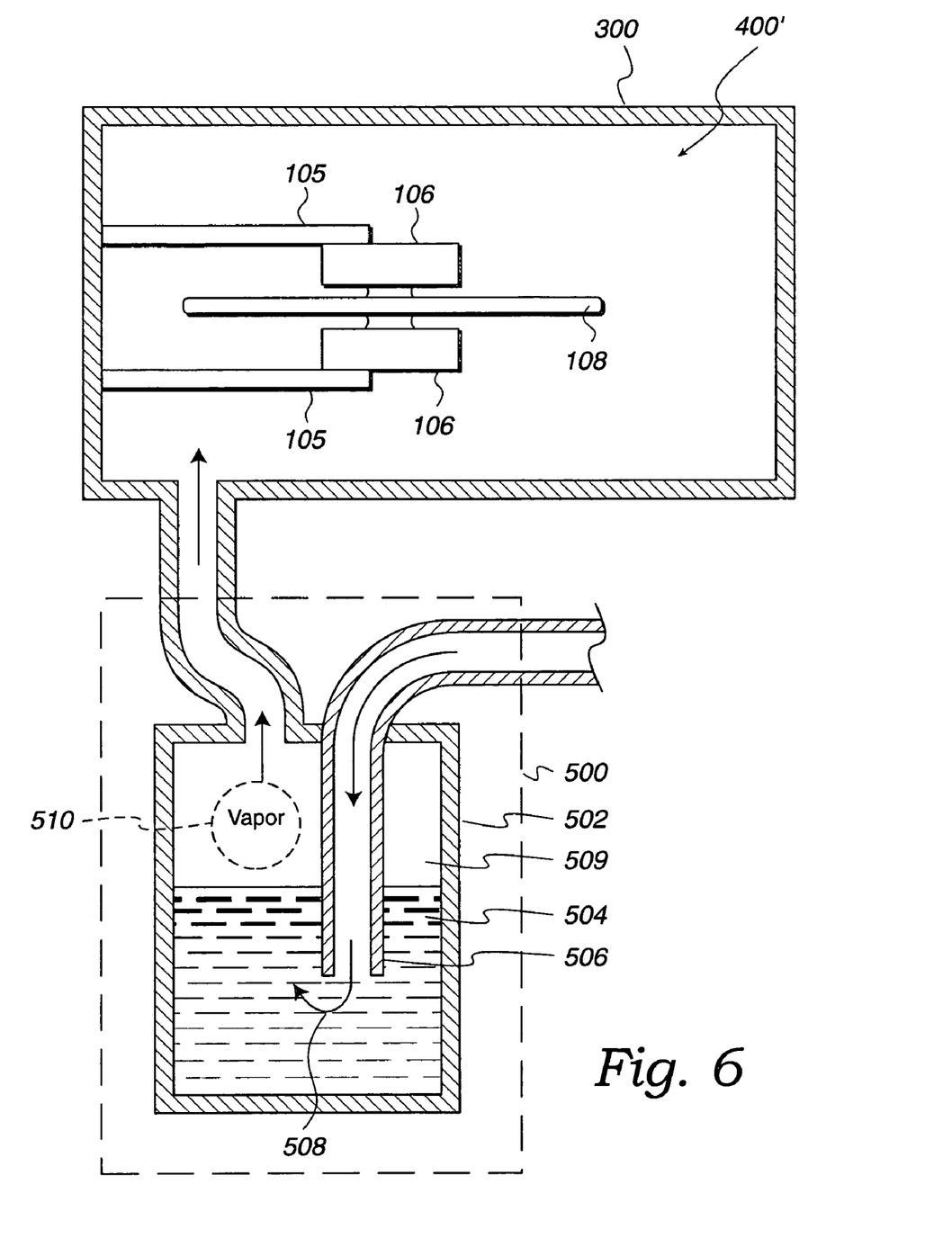
FIG. 6 illustrates a wafer processing environment in accordance with one embodiment of the present invention.

FIG. 6 illustrates a wafer processing environment 400' in accordance with one embodiment of the present invention. The wafer processing environment 400', in one embodiment, includes substantially all of the wafer processing chamber 300. The wafer processing environment 400' may be generated by inputting gas(es) with a high relative humidity from a wafer processing environment generator 500. In another embodiment of the wafer processing environment generator 500, gas(es) that may maintain some concentration of particular liquid in water may be inputted into the wafer processing environment 400'. In one particular embodiment, a specific concentration of IPA including the azeotropic concentration may be maintained in water. It should be appreciated that the wafer processing environment generator 500 may be any suitable apparatus that can input gas(es) and that can manage and control the evaporative rate of fluids within the chamber 300. It should also be understood that the any suitable gas may be utilized that can carry a high level of relative humidity such as, for example, clean dry air (CDA), $N_2$, Ar, etc. In one embodiment, the wafer processing environment generator 500 may input a gas that may have from 50% relative humidity to about 100% relative humidity. In another embodiment, the relative humidity is between about 90% to about 100%, and preferably the gas may have about 100% relative humidity.

In one embodiment, the wafer processing environment generator 500 is a bubbler 502 which is at least partially filled with liquid 504. It should be appreciated that the liquid 504 may be any suitable liquid or combination of liquids that can generate a gas/vapor with a high relative humidity when a gas is passed through the liquid 504. In one embodiment, an input 506 such as, for example, a tube may apply a gas 508 to the liquid 504. It should be appreciated that the liquid 504 may be any suitable type of liquid that may optionally include any suitable mixture, including azeotropic mixtures such as, for example DIW and HCl, DIW and HF, DIW and IPA, etc. In one embodiment, the liquid may be DIW while in another embodiment, the liquid 504 may be DIW and liquid IPA. In yet another embodiment the liquid 504 may be IPA. The gas 508 may pass through the liquid 504 and then bubble up as a vapor 510 which may be gas or the gas with a high relative humidity. In one embodiment, by exposing gas 508 to the liquid 504 during the bubble-up process, the gas 508 may be infused with high relative humidity content to generate the vapor 510. The vapor 510 may then be inputted into the chamber 300 to generate the wafer processing environment 400'. Once the gas 508 has been inputted into the chamber 300, the humidity level of the atmosphere in the chamber 300 may be increased thereby decreasing the evaporation rate of fluids within the chamber 300. Therefore, fluids on the wafer 108 being processed by the meniscus 104 may have a low evaporative rate. To put it another way, fluids on the wafer 108 are managed to prevent or reduce the generation of a thin film of fluid in unprocessed portions of the wafer 108. By increasing the concentration of the humidifying solute in the gas 508, the amount of fluid molecules evaporating into the atmosphere from the unprocessed wafer surface may be made substantially equal to the amount of fluid molecules hitting the wafer surface and staying on the wafer surface thereby reducing unwanted evaporation/drying.

It should be appreciated that in the embodiments described herein, other atmospheric conditions such as ambient temperature, barometric pressure, etc. may affect the degree of evaporative loss of fluid from a wafer surface. Therefore, it should be understood that for each different type of atmospheric condition, different levels of humidity may be needed to achieve a controlled decrease of unwanted evaporative fluid loss from the wafer.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. An apparatus for processing a substrate, comprising:
   a top and bottom proximity head defined in a non-contact orientation from the substrate, each proximity head defined to generate a fluid meniscus to process a substrate surface, the proximity head having a head surface that includes a plurality of discrete conduits for delivering and removing fluid to define the fluid meniscus that is contained between the head surface and the substrate surface;
   a chamber configured to house and surround the top and bottom proximity heads, wherein the top proximity head faces the fluid meniscus down on top of the substrate and the bottom proximity head faces the fluid meniscus up toward the substrate; and
   an environment generator coupled to the chamber, the environment generator is defined to produce an environmental control gas that is communication with the chamber through a conduit, such that the chamber maintains the environmental control gas to define a humidity level in and around the proximity head that is housed by the chamber.

2. An apparatus for processing a substrate as recited in claim 1, wherein the environment generator is a bubbler.

3. An apparatus for processing a substrate as recited in claim 2, wherein the bubbler is configured to input a gas into a liquid bath and further configured to capture the gas that has traveled through the liquid bath.

4. An apparatus for processing a substrate as recited in claim 1, wherein the environmental control gas is a high relative humidity gas.

5. An apparatus for processing a substrate as recited in claim 1, wherein the environmental control gas maintains a concentration of a particular liquid in water.

6. An apparatus for processing a substrate as recited in claim 5, wherein the particular liquid is one of isopropyl alcohol, DIW and IPA, alcohol, DIW and alcohol, ketone, and ether.

7. An apparatus for processing a substrate, comprising:
   a first proximity head defined to generate a fluid meniscus to process a substrate surface, the first proximity head having a head surface that includes a plurality of discrete conduits for delivering and removing fluid to define the fluid meniscus that is contained between the head surface and the substrate surface, the head surface of the first proximity head being in a non-contact orientation from the substrate; and an inlet located on the head surface of the proximity head, the inlet being separate from the plurality of discrete conduits for delivering and removing the fluid to define the fluid meniscus, the inlet defined to apply an environmental control gas to a region between the head surface and the substrate surface that is on a leading edge side of the proximity head to define a control envelope around the inlet at the leading edge side of the proximity head, wherein the substrate is configured to move relative to the first proximity head to act on unprocessed surface regions, such that the leading edge side of the proximity head encounters the unprocessed surface regions first, before the fluid meniscus encounters the unprocessed surface regions.

8. An apparatus for processing a substrate as recited in claim 7, wherein the environmental control gas reduces an evaporation rate of fluids from a surface of the proximity head.

9. An apparatus for processing a substrate as recited in claim 7, wherein the environmental control gas is a high relative humidity gas.

10. An apparatus for processing a substrate as recited in claim 7, wherein the gas with a high relative humidity has a relative humidity between about 50% and about 100%.

11. An apparatus for processing a substrate as recited in claim 9, wherein the gas with the high relative humidity has a relative humidity between about 90% and about 100%.

12. An apparatus for processing a substrate as recited in claim 9, wherein the gas with the high relative humidity has a relative humidity of about 100%.

13. An apparatus for processing a substrate as recited in claim 7, wherein the environmental control gas maintains a concentration of a particular liquid in water.

14. An apparatus for processing a substrate, comprising:

a first arm;

a first proximity head coupled to the first arm that places the first proximity head in a non-contact orientation relative to the substrate, the first proximity head defined to generate a first fluid meniscus to process a top side of a substrate surface, the first proximity head having a head surface that includes a plurality of discrete conduits for delivering and a plurality of discrete conduits for removing fluid to define the first fluid meniscus that is to be contained between the head surface of the first proximity head and the top side of the substrate surface;

a second arm;

a second proximity head coupled to the second arm that places the second proximity head in a non-contact orientation relative to the substrate, the second proximity head defined to generate a second fluid meniscus to process a bottom side of the substrate surface; the second proximity head having a head surface that includes a plurality of discrete conduits for delivering and a plurality of discrete conduits for removing fluid to define the second fluid meniscus that is to be contained between the head surface of the second proximity head and the bottom side of the substrate surface, the first and second proximity head configured to operate substantially simultaneously; and a chamber configured to house and surround the first and second proximity heads, the chamber having inputs to supply an environmental control gas, the chamber being defined to maintain the environmental control gas in a particular condition when the first fluid meniscus and the second fluid meniscus are defined.

15. An apparatus for processing a substrate, comprising:

a first arm;

a first proximity head coupled to the first arm that places the first proximity head in a non-contact orientation relative to the substrate, the first proximity head defined to generate a first fluid meniscus to process a top side of a substrate surface, the first proximity head having a head surface that includes a plurality of discrete conduits for delivering and a plurality of discrete conduits for removing fluid to define the first fluid meniscus that is to be contained between the head surface of the first proximity head and the first side of the substrate surface;

a first fluid sensor associated with the first proximity head;

a second arm;

a second proximity head coupled to the second arm that places the second proximity head in a non-contact orientation relative to the substrate, the second proximity head defined to generate a second fluid meniscus to process a bottom side of the substrate surface; the second proximity head having a head surface that includes a plurality of discrete conduits for delivering and a plurality of discrete conduits for removing fluid to define the second fluid meniscus that is to be contained between the head surface of the second proximity head and the bottom side of the substrate surface, the first and second proximity head configured to operate substantially simultaneously;

a second fluid sensor associated with the second proximity head;

a chamber configured to house and surround the first and second proximity heads; and a control input for configuring delivery of an environmental control gas into the chamber, the control input receiving data from the first and second fluid sensors so as to configure the delivery of the environmental control gas.

* * * * *